(12) United States Patent
Xianyu et al.

(10) Patent No.: US 9,905,606 B2
(45) Date of Patent: Feb. 27, 2018

(54) PHOTODETECTING DEVICE AND MANUFACTURING METHOD THEREOF, AND IMAGE SENSOR AND MANUFACTURING METHOD THEREOF

(71) Applicant: SAMSUNG ELECTRONICS CO., LTD., Suwon-si (KR)

(72) Inventors: Wenxu Xianyu, Suwon-si (KR);
Yongyoung Park, Hwaseong-si (KR);
Wooyoung Yang, Hwaseong-si (KR);
Jeongyub Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/002,755

(22) Filed: Jan. 21, 2016

(65) Prior Publication Data

US 2016/0240580 A1    Aug. 18, 2016

(30) Foreign Application Priority Data

Feb. 12, 2015    (KR) .................. 10-2015-0021778

(51) Int. Cl.
| | |
|---|---|
| *H01L 27/146* | (2006.01) |
| *H01L 31/0352* | (2006.01) |
| *H01L 31/0224* | (2006.01) |
| *H01L 27/144* | (2006.01) |

(52) U.S. Cl.
CPC .. *H01L 27/14647* (2013.01); *H01L 27/14601* (2013.01); *H01L 27/14607* (2013.01); *H01L 27/14692* (2013.01); *H01L 27/1446* (2013.01); *H01L 27/14627* (2013.01); *H01L 31/022408* (2013.01); *H01L 31/022425* (2013.01); *H01L 31/035227* (2013.01)

(58) Field of Classification Search
CPC ......... H01L 27/14647; H01L 27/14601; H01L 27/14607; H01L 27/14692; H01L 27/14627
See application file for complete search history.

(56) References Cited

U.S. PATENT DOCUMENTS

| | | | | |
|---|---|---|---|---|
| 5,877,492 | A * | 3/1999 | Fujieda ................ | G02B 6/1245 250/208.1 |
| 6,841,411 | B1 * | 1/2005 | Varghese .......... | H01L 27/14632 257/E27.133 |
| 7,910,462 | B2 * | 3/2011 | Kelman .......... | H01L 21/823807 117/101 |

(Continued)

OTHER PUBLICATIONS

Park et al., "Filter-Free Image Sensor Pixels Comprising Silicon Nanowires with Selective Color Absorption", Nano Letters, Mar. 3, 2014, vol. 14, pp. 1804-09.*

(Continued)

*Primary Examiner* — Tom Thomas
*Assistant Examiner* — Vincent Wall
(74) *Attorney, Agent, or Firm* — Sughrue Mion, PLLC

(57) ABSTRACT

A photodetecting device, a method of manufacturing the photodetecting device, an image sensor, and a method of manufacturing the image sensor are provided. The photodetecting device includes a first insulation layer, a silicon layer disposed on the first insulation layer, a metal plug disposed through the first insulation layer and the silicon layer, a silicon wire disposed on the silicon layer, and an electrode connected to the silicon wire.

16 Claims, 24 Drawing Sheets

(56) References Cited

U.S. PATENT DOCUMENTS

| | | | |
|---|---|---|---|
| 8,120,079 B2 | 2/2012 | Augusto | |
| 8,304,759 B2 | 11/2012 | Dutta | |
| 8,330,090 B2 * | 12/2012 | Agarwal | H01L 27/1446 |
| | | | 250/208.2 |
| 8,440,997 B2 | 5/2013 | Wang et al. | |
| 8,569,855 B2 | 10/2013 | Yokogawa | |
| 8,692,301 B2 | 4/2014 | Samuelson et al. | |
| 9,082,673 B2 * | 7/2015 | Yu | H01L 27/14 |
| 9,324,747 B2 * | 4/2016 | Yamazaki | H01L 27/14616 |
| 2008/0283883 A1 * | 11/2008 | Shim | B82Y 10/00 |
| | | | 257/292 |
| 2009/0166787 A1 * | 7/2009 | Park | H01L 27/14634 |
| | | | 257/458 |
| 2009/0286346 A1 * | 11/2009 | Adkisson | H01L 27/14618 |
| | | | 438/65 |
| 2009/0289320 A1 * | 11/2009 | Cohen | B82Y 10/00 |
| | | | 257/458 |
| 2011/0115004 A1 * | 5/2011 | Gebara | H01L 27/14634 |
| | | | 257/292 |
| 2011/0115041 A1 | 5/2011 | Dan et al. | |
| 2011/0162698 A1 * | 7/2011 | Wenxu | B82Y 30/00 |
| | | | 136/255 |
| 2015/0086871 A1 * | 3/2015 | Cao | H01M 4/134 |
| | | | 429/220 |

OTHER PUBLICATIONS

Hyunsung Park, et al; "Filter-Free Image Sensor Pixels Comprising Silicon Nanowires with Selective Color Absorption"; Nano Letters; Mar. 3, 2014; vol. 14; pp. 1804-1809.

* cited by examiner

PHOTODETECTING DEVICE AND MANUFACTURING METHOD THEREOF, AND IMAGE SENSOR AND MANUFACTURING METHOD THEREOF

CROSS-REFERENCE TO RELATED APPLICATION

This application claims priority from Korean Patent Application No. 10-2015-0021778, filed on Feb. 12, 2015, in the Korean Intellectual Property Office, the disclosure of which is incorporated herein by reference in its entirety.

BACKGROUND

1. Field

Apparatuses and methods consistent with exemplary embodiments relate to a photodetecting device and a method of manufacturing the photodetecting device, and an image sensor and a method of manufacturing the image sensor.

2. Description of the Related Art

In a general color image sensor, a response process through an organic color filter may embody, for example, red (R), green (G), and blue (B). However, the organic color filter may have demerits such as short durability, a low absorption coefficient, and a complex manufacturing process. Also, when an ultraviolet (UV) ray is irradiated and a process temperature is high, characteristics of the organic color filter may deteriorate. To embody a high resolution, a size of a pixel may be reduced. Accordingly, it may be difficult to manufacture an organic color filter corresponding to such a pixel size.

SUMMARY

Exemplary embodiments address at least the above disadvantages and other disadvantages not described above. Also, the exemplary embodiments are not required to overcome the disadvantages described above, and may not overcome any of the problems described above.

Exemplary embodiments provide a photodetecting device and a method of manufacturing the photodetecting device, and an image sensor and a method of manufacturing the image sensor.

According to an aspect of an exemplary embodiment, there is provided a photodetecting device including a first insulation layer, a silicon layer disposed on the first insulation layer, a metal plug disposed through the first insulation layer and the silicon layer, a silicon wire disposed on the silicon layer, and an electrode connected to the silicon wire.

The photodetecting device may further include a second insulation layer disposed between the silicon layer and the electrode, the second insulation layer encompassing the silicon wire.

The photodetecting device may further include a catalyst layer disposed between the first insulation layer and the silicon layer.

The catalyst layer may include metal oxide having insulation properties.

The silicon wire may include a first silicon wire disposed on the silicon layer, and a second silicon wire extending from the first silicon wire, the second silicon wire being connected to the electrode.

The silicon layer may include first conductive type silicon.

The first silicon wire may include the first conductive type silicon or undoped silicon, and the second silicon wire may include second conductive type silicon.

The silicon wire may include a first silicon wire, a second silicon wire extending from an end of the first silicon wire, the second silicon wire being connected to the electrode. The silicon wire may further include a third silicon wire extending from another end of the first silicon wire, the third silicon wire being connected to the silicon layer.

The first silicon wire may include undoped silicon, the silicon layer and the third silicon wire may include first conductive type silicon, and the second silicon wire may include second conductive type silicon.

The photodetecting device may further include a lens layer disposed on the electrode.

The photodetecting device may further include a planarization layer disposed between the electrode and the lens layer.

According to an aspect of another exemplary embodiment, there is provided an image sensor having pixels, each of the pixels including a circuit substrate and photodetecting devices disposed on the circuit substrate. Each of the photodetecting devices includes a first insulation layer, a silicon layer disposed on the first insulation layer, and a metal plug disposed through the first insulation layer and the silicon layer, the metal plug being connected to the circuit substrate. Each of the photodetecting devices further includes a silicon wire disposed on the silicon layer, and a second insulation layer disposed on the silicon layer, the second insulation layer encompassing the silicon wire. Each of the photodetecting devices further includes an electrode disposed on the second insulation layer, the electrode being connected to the silicon wire.

The photodetecting devices may further include silicon wires having different diameters, and the silicon wires may be configured to detect light beams of different colors.

The circuit substrate may include one among a complementary metal-oxide-semiconductor substrate, a printed circuit board, and a display panel.

Each of the photodetecting devices may further include a catalyst layer disposed between the first insulation layer and the silicon layer.

Each of the photodetecting devices may further include a line pattern through the silicon layer and the catalyst layer, the line pattern being disposed between two of the photodetecting devices.

According to an aspect of another exemplary embodiment, there is provided a method of manufacturing a photodetecting device, the method including forming a catalyst layer on a first insulation layer, forming an amorphous silicon layer on the catalyst layer, forming a metal plug through the amorphous silicon layer, the catalyst layer, and the first insulation layer, forming a second insulation layer on the amorphous silicon layer, forming a hole in the second insulation layer to expose the amorphous silicon layer, forming an amorphous silicon wire by filling the hole with amorphous silicon, forming a silicon layer and a silicon wire by crystallizing the amorphous silicon layer and the amorphous silicon wire, and forming an electrode on the second insulation layer to connect the electrode to the silicon wire.

The forming the silicon layer and the silicon wire may include forming the silicon layer and the silicon wire by crystallizing the amorphous silicon layer and the amorphous silicon wire using a metal-induced crystallization.

The method may further include doping an upper portion of the amorphous silicon wire.

The forming the amorphous silicon wire may include forming the amorphous silicon wire by filling the hole with doped amorphous silicon and undoped amorphous silicon.

According to an aspect of another exemplary embodiment, there is provided a method of manufacturing an image sensor, the method including forming a first insulation layer on a circuit substrate, forming a catalyst layer on the first insulation layer, forming an amorphous silicon layer on the catalyst layer, and forming a metal plug through the amorphous silicon layer, the catalyst layer, and the first insulation layer to connect the metal plug to the circuit substrate. The method further includes forming a second insulation layer on the amorphous silicon layer, forming a hole in the second insulation layer to expose the amorphous silicon layer, forming an amorphous silicon wire by filling the hole with amorphous silicon, forming a silicon layer and a silicon wire by crystallizing the amorphous silicon layer and the amorphous silicon wire, and forming an electrode on the second insulation layer to connect the electrode to the silicon wire.

According to an aspect of another exemplary embodiment, there is provided a method of manufacturing an image sensor, the method including forming photodetecting devices, and transferring the photodetecting devices to form the photodetecting devices on a circuit substrate. The forming each of the photodetecting devices includes forming a catalyst layer on a first insulation layer, forming an amorphous silicon layer on the catalyst layer, forming a metal plug through the amorphous silicon layer, the catalyst layer, and the first insulation layer, forming a second insulation layer on the amorphous silicon layer, forming a hole in the second insulation layer to expose the amorphous silicon layer, forming an amorphous silicon wire by filling the hole with amorphous silicon, forming a silicon layer and a silicon wire by crystallizing the amorphous silicon layer and the amorphous silicon wire, and forming an electrode on the second insulation layer to connect the electrode to the silicon wire.

The forming each of the photodetecting devices may further include forming a line pattern through the amorphous silicon layer and the catalyst layer, the line pattern being between two of the photodetecting devices.

BRIEF DESCRIPTION OF THE DRAWINGS

The above and/or other aspects will be more apparent by describing in detail exemplary embodiments with reference to the accompanying drawings, in which.

DETAILED DESCRIPTION OF THE EXEMPLARY EMBODIMENTS

Figure 1:
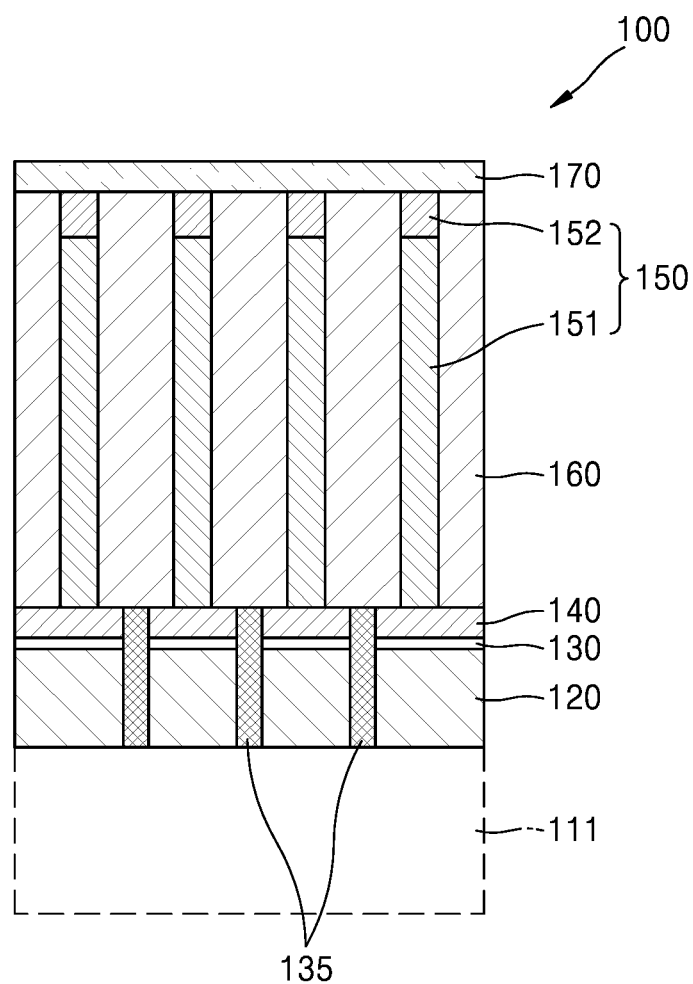
FIG. 1 is a cross-sectional view of a photodetecting device according to an exemplary embodiment.

Exemplary embodiments are described in more detail with reference to the accompanying drawings.

In the following description, like reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail because they would obscure the description with unnecessary detail.

Also, a thickness or size of each layer illustrated in the drawings may be exaggerated for convenience of explanation and clarity. In the drawings, the thicknesses of layers and regions may be exaggerated for clarity. In the following description, when a layer is described to exist on another layer, the layer may exist directly on the other layer or a third layer may be interposed therebetween. In the following exemplary embodiments, a material forming each layer is an exemplary embodiment, and thus, other materials may be employed therefor.

FIG. 1 is a cross-sectional view of a photodetecting device 100 according to an exemplary embodiment.

Referring to FIG. 1, the photodetecting device 100 includes a first insulation layer 120, a catalyst layer 130, a silicon layer 140, a plurality of metal plugs 135, a plurality of silicon (Si) nanowires 150, a second insulation layer 160, and an electrode 170. The first insulation layer 120 may be disposed on a substrate 111. For example, the substrate 111 may include a hard material substrate or a soft material substrate. Also, for example, the substrate 111 may include a circuit substrate having an electrode pattern such as a complementary metal-oxide-semiconductor (CMOS) substrate, a printed circuit board (PCB), or a display panel. The first insulation layer 120 may include, for example, silicon oxide, silicon nitride, or aluminum oxide.

The silicon layer 140 is disposed on the first insulation layer 120. The silicon layer 140 may have a crystalline structure. The silicon layer 140 may include first conductive type silicon. For example, the silicon layer 140 may include n type silicon. In a detailed example, the silicon layer 140 may include n+ type silicon. The n+ type silicon refers to n type silicon having a high impurity doping concentration. Alternatively, the silicon layer 140 may include p type silicon. In this example, the silicon layer 140 may include p+ type silicon. The p+ type silicon may refer to p type silicon having a high impurity doping concentration.

The catalyst layer 130 is disposed between the first insulation layer 120 and the silicon layer 140. The catalyst layer 130 that is used to crystallize amorphous silicon as described below may include metal oxide having insulation properties. For example, the catalyst layer 130 may include nickel oxide, cobalt oxide, or copper oxide. The catalyst layer 130 may be formed by, for example, atomic layer deposition (ALD), physical vapor deposition (PVD), or chemical vapor deposition (CVD). Alternatively, in another exemplary embodiment, the catalyst layer 130 may not be disposed between the first insulation layer 120 and the silicon layer 140.

The metal plugs 135 are disposed to penetrate through the first insulation layer 120, the catalyst layer 130, and the silicon layer 140. A plurality of via holes may be formed through the first insulation layer 120, the catalyst layer 130, and the silicon layer 140. The metal plugs 135 may fill the via holes. The metal plugs 135 may include metal exhibiting superior conductivity. Alternatively, although the metal plugs 135 are illustrated as penetrating through the first insulation layer 120, the catalyst layer 130, and the silicon layer 140, only one metal plug may disposed to penetrate through the first insulation layer 120, the catalyst layer 130, and the silicon layer 140.

The Si nanowires 150 are disposed on the silicon layer 140. Each of the Si nanowires 150 may have a crystalline structure. The Si nanowires 150 are disposed to be perpendicular to the silicon layer 140. However, exemplary embodiments are not limited thereto, and the Si nanowires 150 may be disposed to be inclined at an angle with respect to the silicon layer 140. Each of the Si nanowires 150 includes a first Si nanowire 151 disposed on the silicon layer 140 and a second Si nanowire 152 extending from the first Si nanowire 151.

The first Si nanowire 151 disposed on the silicon layer 140 may include first conductive type silicon. For example, if the silicon layer 140 includes n type silicon, the first Si nanowire 151 may include n type silicon. In a detailed example, if the silicon layer 140 includes n+ type silicon, the first Si nanowire 151 may include n− type silicon. The n− type silicon refers to n type silicon having an impurity doping concentration that is lower than that of n+ type silicon. Alternatively, if the silicon layer 140 includes p type silicon, the first Si nanowire 151 may include p type silicon. In a detailed example, if the silicon layer 140 includes p+ type silicon, the first Si nanowire 151 may include p− type silicon. The p− type silicon refers to p type silicon having an impurity doping concentration that is lower than that of p+ type silicon. Alternatively, the first Si nanowire 151 may include undoped silicon.

The second Si nanowire 152 extending from the first Si nanowire 151 may include second conductive type silicon. For example, if the silicon layer 140 includes n type silicon, the second Si nanowire 152 may include p type silicon. In a detailed example, if the silicon layer 140 and the first Si nanowire 151 include n+ type silicon and n− type silicon, respectively, the second Si nanowire 152 may include p+ type silicon. In this example, the silicon layer 140, the first Si nanowire 151, and the second Si nanowire 152 may form a p-n junction. Also, in another detailed example, if the silicon layer 140 and the first Si nanowire 151 include n+ type silicon and undoped silicon, respectively, the second Si nanowire 152 may include p+ type silicon. In this example, the silicon layer 140, the first Si nanowire 151, and the second Si nanowire 152 may form a p-i-n junction.

If the silicon layer 140 includes p type silicon, the second Si nanowire 152 may include n type silicon. In a detailed example, if the silicon layer 140 and the first Si nanowire 151 include p+ type silicon and p− type silicon, respectively, the second Si nanowire 152 may include n+ type silicon. In this example, the silicon layer 140, the first Si nanowire 151, and the second Si nanowire 152 may form a p-n junction. Also, in another detailed example, if the silicon layer 140 and the first Si nanowire 151 include p+ type silicon and undoped silicon, respectively, the second Si nanowire 152 may include n+ type silicon. In this example, the silicon layer 140, the first Si nanowire 151, and the second Si nanowire 152 may form a p-i-n junction.

Each of the Si nanowires 150 including the first Si nanowire 151 and the second Si nanowire 152 may have a diameter of about several nanometers to several hundreds of nanometers and a height of about several micrometers to several tens of micrometers. However, exemplary embodiments are not limited thereto. The Si nanowires 150 may detect light beams having different wavelengths according to diameters thereof. For example, as the diameters of the Si nanowires 150 increase, a light beam having a long wavelength, for example, a red light beam, may be detected. As the diameters of the Si nanowires 150 decrease, a light beam having a short wavelength, for example, a blue light beam, may be detected. Alternatively, although the Si nanowires 150 are disposed on the silicon layer 140, only one Si nanowire may be disposed on the silicon layer 140.

The second insulation layer 160 is disposed on the silicon layer 140, thus encompassing the Si nanowires 150. The second insulation layer 160 may have a thickness corresponding to heights of the Si nanowires 150. Accordingly, the second insulation layer 160 may have a thickness of about several micrometers to several tens of micrometers. The second insulation layer 160 may include, for example, silicon oxide, silicon nitride, or aluminum oxide. Alternatively, in another exemplary embodiment, the second insulation layer 160 that encompasses the Si nanowires 150 may not be disposed.

The electrode 170 is disposed on the second insulation layer 160. The electrode 170 is electrically connected to upper ends of the Si nanowires 150, that is, upper ends of the second Si nanowires 152. The electrode 170 may include, for example, transparent conductive oxide (TCO) such as indium tin oxide (ITO).

In the above structure, when external light is incident upon the photodetecting device 100, electrons and holes are generated in the p-n junction or p-i-n junction of the photodetecting device 100. Accordingly, as current flows through the electrode 170 and the metal plugs 135, the external light may be detected. In this state, light beams having various wavelengths may be detected by changing the diameters of the Si nanowires 150 forming the photodetecting device 100. Alternatively, by providing a plurality of the above-described photodetecting devices and varying the diameters of the Si nanowires 150 of the photodetecting devices, an image sensor for forming a color image may be manufactured.

Figure 2:
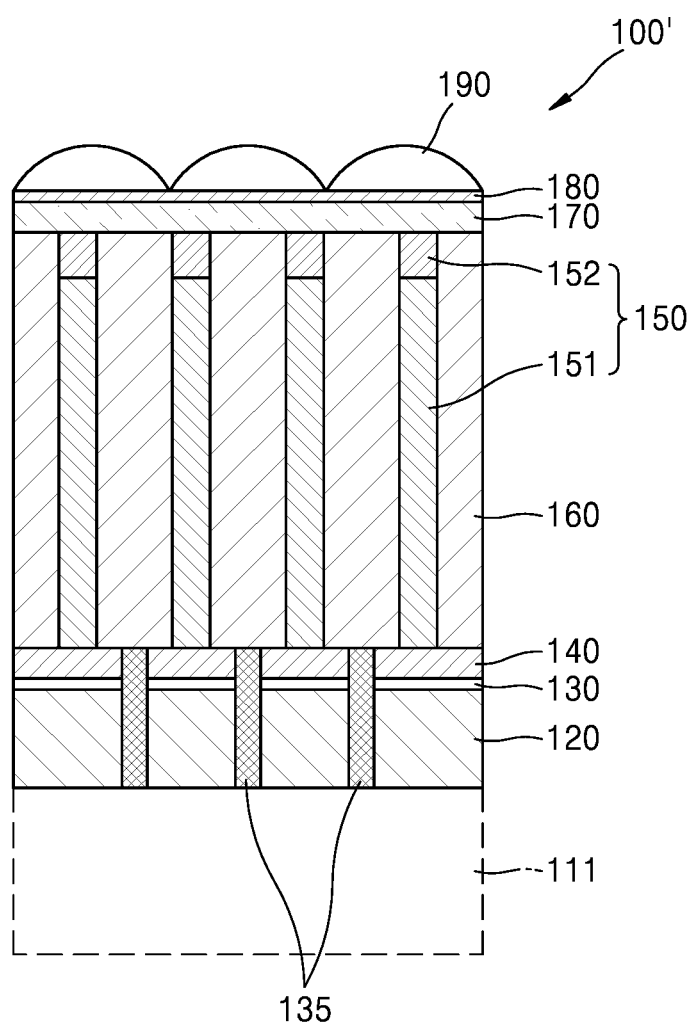
FIG. 2 is a cross-sectional view of a photodetecting device according to another exemplary embodiment.

FIG. 2 is a cross-sectional view of a photodetecting device 100' according to another exemplary embodiment.

Referring to FIG. 2, the photodetecting device 100' further includes a planarization layer 180 and a microlens layer 190. The microlens layer 190 is disposed on the electrode 170 that is disposed on the upper ends of the Si nanowires 150. The planarization layer 180 is disposed between the electrode 170 and the microlens layer 190. The microlens layer 190 focuses the external light to be efficiently incident upon the Si nanowires 150. The planarization layer 180 is disposed on an irregular upper surface of the electrode 170, which is formed due to formation of the Si nanowires 150 and the second insulation layer 160, thereby providing a planarized upper surface. The microlens layer 190 may be effectively formed on the planarized upper surface of the planarization layer 180.

Figure 3:
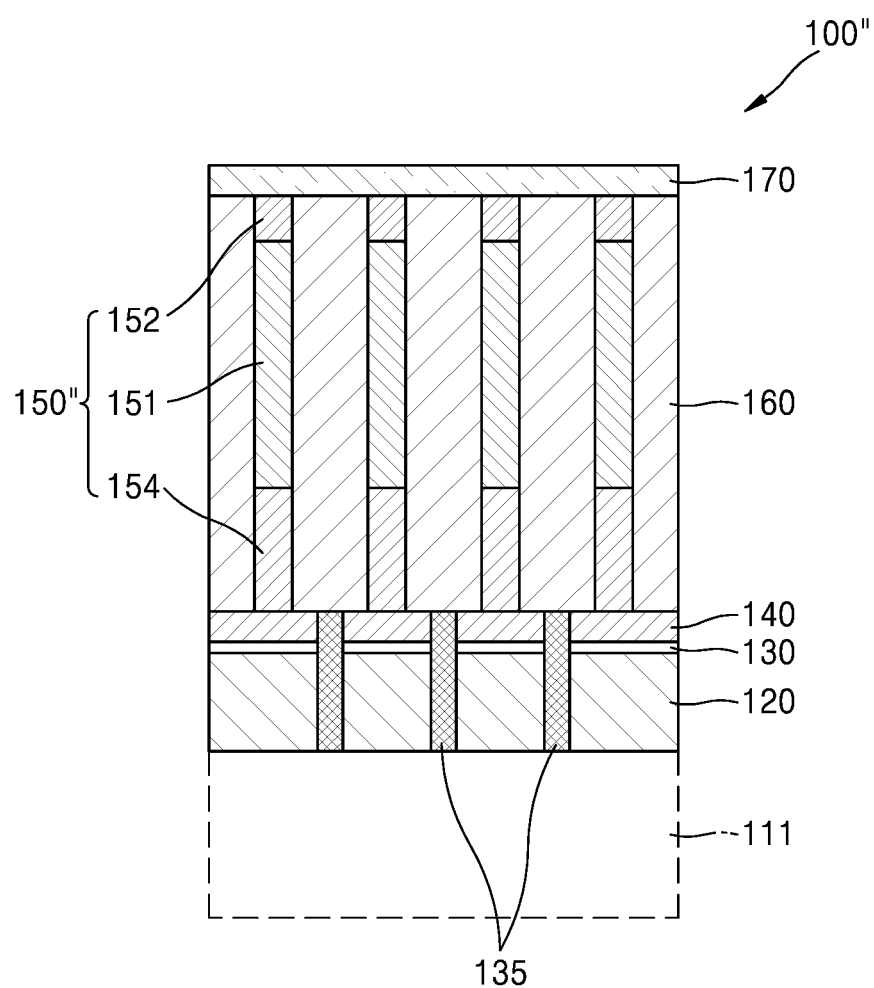
FIG. 3 is a cross-sectional view of a photodetecting device according to another exemplary embodiment.

FIG. 3 is a cross-sectional view of a photodetecting device 100" according to another exemplary embodiment.

Referring to FIG. 3, the photodetecting device 100" further includes a Si nanowire 150" that includes the first Si nanowire 151, the second Si nanowire 152 extending from an upper end of the first Si nanowire 151, and a third Si nanowire 154 extending from a lower end of the first Si nanowire 151. The second Si nanowire 152 is connected to the electrode 170, and the third Si nanowire 154 is connected to the silicon layer 140. Accordingly, the third Si nanowire 154 may include first conductive type silicon, and the second Si nanowire 152 may include second conductive type silicon. The first Si nanowire 151 may include undoped silicon. Alternatively, although not illustrated in FIG. 3, the photodetecting device 100" may further include the planarization layer 180 and the microlens layer 190 disposed on the electrode 170.

Figure 4:
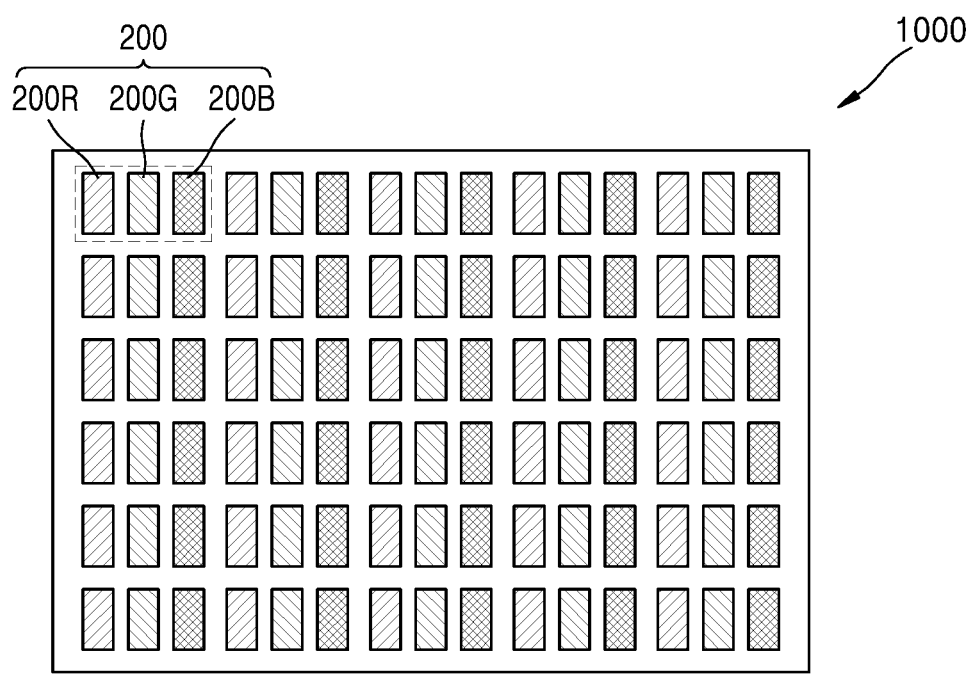
FIG. 4 is a plan view of an image sensor according to an exemplary embodiment.
Figure 5:
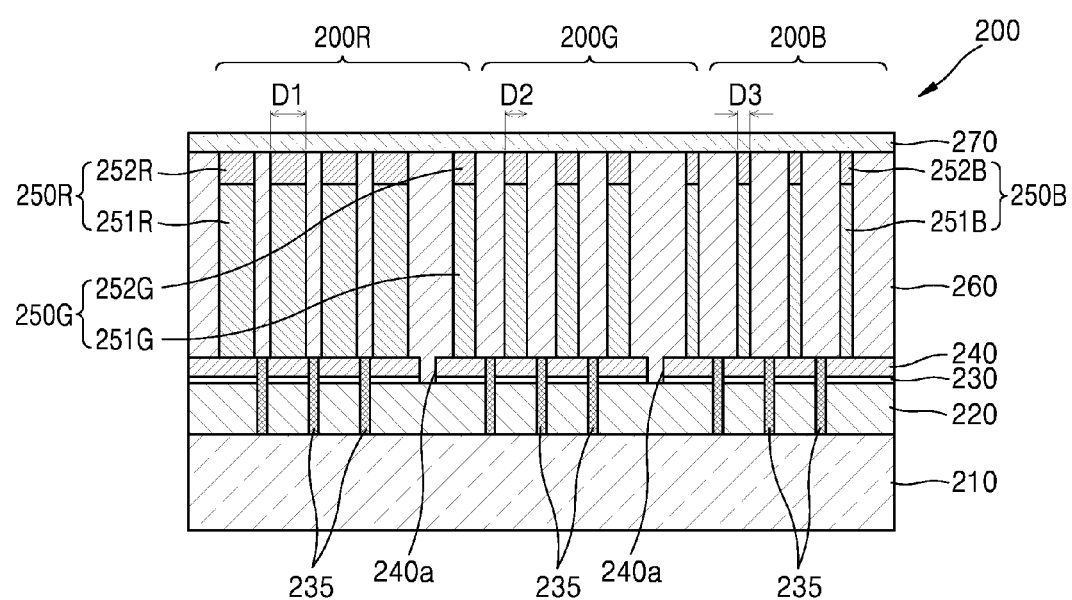
FIG. 5 is a cross-sectional view of a pixel of the image sensor of FIG. 4.

FIG. 4 is a plan view of an image sensor 1000 according to an exemplary embodiment. FIG. 5 is a cross-sectional view of a pixel 200 of the image sensor 1000 of FIG. 4.

Referring to FIGS. 4 and 5, the image sensor 1000 includes pixels including the pixel 200. Each of the pixels includes a red photodetecting device 200R, a green photodetecting device 200G, and a blue photodetecting device 200B, which are disposed on a circuit substrate 210. However, this is an example, and numbers and colors of the photodetecting devices 200R, 200G, and 200B included in each of the pixels 200 may be variously modified.

The circuit substrate 210 includes an electrode pattern that is electrically connected to the photodetecting devices 200R, 200G, and 200B. The circuit substrate 210 may be, for example, a CMOS substrate. An image sensor where the photodetecting devices 200R, 200G, and 200B are disposed on a CMOS substrate may be referred to as a CMOS image sensor (CIS). Alternatively, the circuit substrate 210 may include for example, a PCB or a display panel. However, exemplary embodiments are not limited thereto.

The red photodetecting device 200R includes a first insulation layer 220, a catalyst layer 230, a silicon layer 240, at least one metal plug 235, at least one red Si nanowire 250R, a second insulation layer 260, and an electrode 270, which are disposed on the circuit substrate 210. The first insulation layer 220 may include, for example, silicon oxide, silicon nitride, or aluminum oxide.

The silicon layer 240 is disposed on the first insulation layer 220. The silicon layer 240 may have a crystalline structure. The silicon layer 240 may include first conductive type silicon. For example, the silicon layer 240 may include n type silicon. Alternatively, the silicon layer 240 may include p type silicon.

The catalyst layer 230 is disposed between the first insulation layer 220 and the silicon layer 240. For example, the catalyst layer 230 may include, for example, nickel oxide, cobalt oxide, or copper oxide. Alternatively, the catalyst layer 230 may not be disposed between the first insulation layer 220 and the silicon layer 240.

The at least one metal plug 235 is disposed to penetrate through the first insulation layer 220, the catalyst layer 230, and the silicon layer 240. Accordingly, the at least one metal plug 235 is electrically connected to the electrode pattern of the circuit substrate 210.

A plurality of line patterns 240a are disposed to penetrate through the silicon layer 240 and the catalyst layer 230. The line patterns 240a insulate (i.e., allow the second insulation layer 260 to be) between the red, green, and blue photodetecting devices 200R, 200G, and 200B.

The at least one red Si nanowire 250R is disposed on the silicon layer 240. The at least one red Si nanowire 250R may have a diameter D1 to detect a red light beam. The at least one red Si nanowire 250R may have the diameter D1 that is greater than those of green and blue Si nanowires 250G and 250B. The at least one red Si nanowire 250R may have a crystalline structure. The at least one red Si nanowire 250R is disposed to be perpendicular to the silicon layer 240. However, exemplary embodiments are not limited thereto, and the at least one red Si nanowire 250R may be disposed to be inclined at an angle with respect to the silicon layer 240.

Each of the red Si nanowires 250R includes a first red Si nanowire 251R disposed on the silicon layer 240 and a second red Si nanowire 252R extending from the first red Si nanowire 251R. The first red Si nanowire 251R may include first conductive type silicon. For example, if the silicon layer 240 includes n type silicon, the first red Si nanowire 251R may include n type silicon. Alternatively, if the silicon layer 240 includes p type silicon, the first red Si nanowire 251R may include p type silicon. Alternatively, the first red Si nanowire 251R may include undoped silicon.

The second red Si nanowire 252R may include second conductive type silicon. For example, if the silicon layer 240 includes n type silicon, the second red Si nanowire 252R may include p type silicon. In this example, if the first red Si nanowire 251R includes n type silicon, a p-n junction may be formed. If the first red Si nanowire 251R includes undoped silicon, a p-i-n junction may be formed.

Alternatively, if the silicon layer 240 includes p type silicon, the second red Si nanowire 252R may include n type silicon. In this example, if the first red Si nanowire 251R includes p type silicon, a p-n junction may be formed. If the first red Si nanowire 251R includes undoped silicon, a p-i-n junction may be formed.

The diameter D1 of the at least one red Si nanowire 250R may be about several nanometers to several hundreds of nanometers, and a height of the at least one red Si nanowire 250R may be about several micrometers to several tens of micrometers. However, exemplary embodiments are not limited thereto.

The second insulation layer 260 is disposed on the silicon layer 240, thus encompassing the at least one red Si nanowire 250R. The second insulation layer 260 may have a thickness corresponding to the height of the at least one red Si nanowire 250R. Accordingly, the second insulation layer 260 may have a thickness of about several micrometers to several tens of micrometers. The second insulation layer 260 may include, for example, silicon oxide, silicon nitride, or aluminum oxide.

The electrode 270 is disposed on the second insulation layer 260. The electrode 270 is electrically connected to an upper end of the at least one red Si nanowire 250R, that is, an upper end of the second red Si nanowire 252R. The electrode 270 may include, for example, TCO such as ITO.

The green photodetecting device 200G includes the first insulation layer 220, the catalyst layer 230, the silicon layer 240, the at least one metal plug 235, at least one green Si nanowire 250G, the second insulation layer 260, and the electrode 270, which are disposed on the circuit substrate 210. Because the circuit substrate 210, the first insulation layer 220, the catalyst layer 230, the silicon layer 240, and the at least one metal plug 235 are described above, descriptions thereof are omitted.

The at least one green Si nanowire 250G is disposed on the silicon layer 240. The at least one green Si nanowire 250G may have a diameter D2 to detect a green light beam. The at least one green Si nanowire 250G may have the diameter D2 that is less than that of the at least one red Si nanowire 250R and greater than that of at least one blue Si nanowire 250B that is described below. The at least one green Si nanowire 250G may have a crystalline structure. The at least one green Si nanowire 250G may be disposed to be perpendicular to the silicon layer 240 or to be inclined at an angle with respect to the silicon layer 240.

Each of the green Si nanowires 250G includes a first green Si nanowire 251G disposed on the silicon layer 240 and a second green Si nanowire 252G extending from the first green Si nanowire 251G. The first green Si nanowire 251G may include first conductive type silicon. For example, if the silicon layer 240 includes n type silicon, the first green Si nanowire 251G may include n type silicon. Alternatively, if the silicon layer 240 includes p type silicon, the first green Si nanowire 251G may include p type silicon. Alternatively, the first green Si nanowire 251G may include undoped silicon.

The second green Si nanowire 252G may include second conductive type silicon. For example, if the silicon layer 240 includes n type silicon, the second green Si nanowire 252G may include p type silicon. In this example, if the first green Si nanowire 251G includes n type silicon, a p-n junction may be formed. If the first green Si nanowire 251G includes undoped silicon, a p-i-n junction may be formed.

Alternatively, if the silicon layer 240 includes p type silicon, the second green Si nanowire 252G may include n type silicon. In this example, if the first green Si nanowire 251G includes p type silicon, a p-n junction may be formed. If the first green Si nanowire 251G includes undoped silicon, a p-i-n junction may be formed.

The diameter D2 of the at least one green Si nanowire 250G may be about several nanometers to several hundreds of nanometers, and a height of the at least one green Si nanowire 250G may be about several micrometers to several tens of micrometers. However, exemplary embodiments are not limited thereto.

The second insulation layer 260 is disposed on the silicon layer 240 to encompass the at least one green Si nanowire 250G. The second insulation layer 260 may have a thickness corresponding to the height of the at least one green Si nanowire 250G.

The electrode 270 is disposed on the second insulation layer 260. The electrode 270 is electrically connected to an upper end of the at least one green Si nanowire 250G, that is, an upper end of the second green Si nanowire 252G.

The blue photodetecting device 200B includes the first insulation layer 220, the catalyst layer 230, the silicon layer 240, the at least one metal plug 235, the at least one blue Si nanowire 250B, the second insulation layer 260, and the electrode 270, which are disposed on the circuit substrate 210. Because the circuit substrate 210, the first insulation layer 220, the catalyst layer 230, the silicon layer 240, and the at least one metal plug 235 are described above, descriptions thereof are omitted.

The at least one blue Si nanowire 250B is disposed on the silicon layer 240. The at least one blue Si nanowire 250B may have a diameter D3 to detect a blue light beam. The at least one blue Si nanowire 250B may have a diameter D3 that is less than those of the at least one red Si nanowire 250R and the at least one green Si nanowire 250G. The at least one blue Si nanowire 250B may have a crystalline structure. The at least one blue Si nanowire 250B may be disposed to be perpendicular to the silicon layer 240 or to be inclined at an angle with respect to the silicon layer 240.

Each of the blue Si nanowires 250B includes a first blue Si nanowire 251B disposed on the silicon layer 240 and a second blue Si nanowire 252B extending from the first blue Si nanowire 251B. The first blue Si nanowire 251B may include first conductive type silicon. For example, if the silicon layer 240 includes n type silicon, the first blue Si nanowire 251B may include n type silicon. Alternatively, if the silicon layer 240 includes p type silicon, the first blue Si nanowire 251B may include p type silicon. Alternatively, the first blue Si nanowire 251B may include undoped silicon.

The second blue Si nanowire 252B may include second conductive type silicon. For example, if the silicon layer 240 includes n type silicon, the second blue Si nanowire 252B may include p type silicon. In this example, if the first blue Si nanowire 251B includes n type silicon, a p-n junction may be formed. If the first blue Si nanowire 251B includes undoped silicon, a p-i-n junction may be formed.

Alternatively, if the silicon layer 240 includes p type silicon, the second blue Si nanowire 252B may include n type silicon. In this example, if the first blue Si nanowire 251B includes p type silicon, a p-n junction may be formed. If the first blue Si nanowire 251B includes undoped silicon, a p-i-n junction may be formed.

The diameter D3 of the at least one blue Si nanowire 250B may be about several nanometers to several hundreds of nanometers, and a height of the at least one blue Si nanowire 250B may be about several micrometers to several tens of micrometers. However, exemplary embodiments are not limited thereto.

The second insulation layer 260 is disposed on the silicon layer 240 to encompass the at least one blue Si nanowire 250B. The second insulation layer 260 may have a thickness corresponding to the height of the at least one blue Si nanowire 250B.

The electrode 270 is disposed on the second insulation layer 260. The electrode 270 is electrically connected to an upper end of the at least one blue Si nanowire 250B, that is, an upper end of the second blue Si nanowire 252B.

In the above-described structure, when external light is incident upon the image sensor 1000, the red, green, and blue photodetecting devices 200R, 200G, and 200B included in each of the pixels 200 detect red, green, and blue light beams, respectively, thereby forming a color image.

Figure 6:
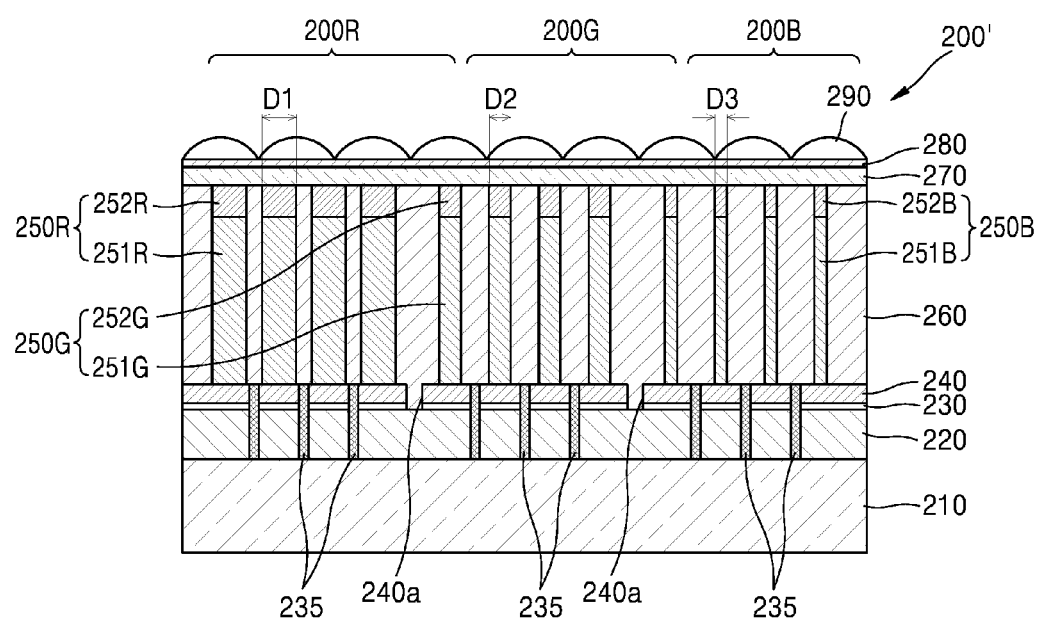
FIG. 6 is a cross-sectional view of a pixel of an image sensor according to another exemplary embodiment.

FIG. 6 is a cross-sectional view of a pixel 200' of an image sensor according to another exemplary embodiment.

Referring to FIG. 6, the pixel 200' includes a microlens layer 290 disposed on the electrode 270 that is disposed on the upper ends of the red, green, and blue Si nanowires 250R, 250G, and 250B. The pixel 200' further includes a planarization layer 280 disposed between the electrode 270 and the microlens layer 290. As described above, the microlens layer 290 focuses the external light to be efficiently incident upon the red, green, and blue Si nanowires 250R, 250G, and 250B. The planarization layer 280 may be disposed on an irregular upper surface of the electrode 270, thereby providing a planarized upper surface. The microlens layer 290 is effectively formed on an upper surface of the planarization layer 280.

Figure 7:
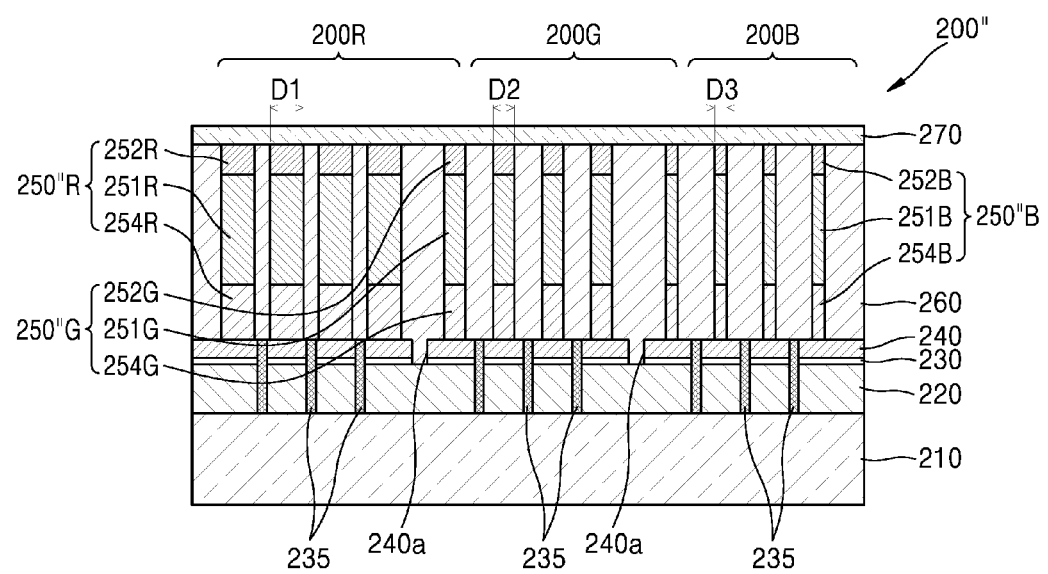
FIG. 7 is a cross-sectional view of a pixel of an image sensor according to another exemplary embodiment.

FIG. 7 is a cross-sectional view of a pixel 200" of an image sensor according to another exemplary embodiment.

Referring to FIG. 7, the pixel 200" includes a red Si nanowire 250"R including the first red Si nanowire 251R, the second red Si nanowire 252R extending from the upper end of the first red Si nanowire 251R, and a third red Si nanowire 254R extending from a lower end of the first red Si nanowire 251R. The second red Si nanowire 252R is connected to the electrode 270, and the third red Si nanowire 254R is connected to the silicon layer 240.

The pixel 200" further includes a green Si nanowire 250"G including the first green Si nanowire 251G, the second green Si nanowire 252G extending from the upper end of the first green Si nanowire 251G, and a third green Si nanowire 254G extending from a lower end of the first green Si nanowire 251G. The second green Si nanowire 252G is connected to the electrode 270, and the third green Si nanowire 254G is connected to the silicon layer 240.

The pixel 200" further includes a blue Si nanowire 250"B including the first blue Si nanowire 251B, the second blue Si nanowire 252B extending from the upper end of the first blue Si nanowire 251B, and a third blue Si nanowire 254B extending from a lower end of the first blue Si nanowire 251B. The second blue Si nanowire 252B is connected to the electrode 270, and the third blue Si nanowire 254B is connected to the silicon layer 240.

The third red, green, and blue Si nanowires 254R, 254G, and 254B may include first conductive type silicon, and the second red, green, and blue Si nanowires 252R, 252G, and 252B may include second conductive type silicon. The first Si nanowires 251R, 251G, and 251B may include undoped silicon. Alternatively, although not illustrated in FIG. 7, the pixel 200" may further include a planarization layer and a microlens layer disposed on the electrode 270.

FIGS. 8 to 18 are diagrams illustrating a method of manufacturing a photodetecting device 300, according to an exemplary embodiment.

Figure 8:
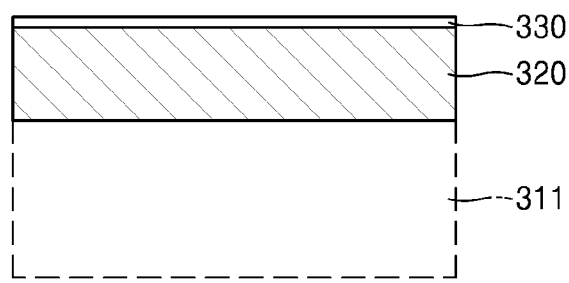
FIGS. 8, 9, 10, 11, 12, 13, 14, 15, 16, 17, and 18 are diagrams illustrating a method of manufacturing a photodetecting device, according to an exemplary embodiment.

Referring to FIG. 8, a first insulation layer 320 is formed. The first insulation layer 320 may be formed on a substrate 311. For example, the substrate 311 may include a hard material substrate or a soft material substrate. In another example, the substrate 311 may include a circuit substrate, on which an electrode pattern is formed, such as a CMOS substrate or a PCB. The first insulation layer 320 may include, for example, silicon oxide, silicon nitride, or aluminum oxide. The first insulation layer 320 may be formed by, for example, PVD, CVD, or ALD.

A catalyst layer 330 is formed on the first insulation layer 320. The catalyst layer 330 may function as a catalyst in crystallizing amorphous silicon by a metal-induced crystallization (MIC) process, as described below. For example, the catalyst layer 330 may include metal oxide having insulation properties. In detail, the catalyst layer 330 may include, for example, nickel oxide. However, exemplary embodiments are not limited thereto, and the catalyst layer 330 may include various metal oxides such as, for example, cobalt oxide or copper oxide. The catalyst layer 330 may be formed by, for example, ALD. However, exemplary embodiments are not limited thereto, and the catalyst layer 330 may be formed by, for example, PVD or CVD.

Figure 9:
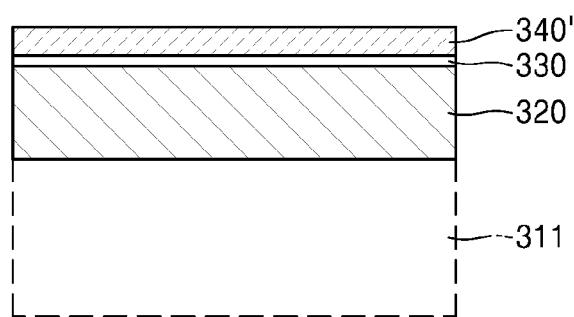

Referring to FIG. 9, an amorphous silicon layer 340' is formed on the catalyst layer 330. The amorphous silicon layer 340' may be formed by, for example, PVD, CVD, or ALD. The amorphous silicon layer 340' may include, for example, first conductive type amorphous silicon. For example, the amorphous silicon layer 340' may include n type amorphous silicon. In a detailed example, the amorphous silicon layer 340' may include n+ type amorphous silicon. The n+ type amorphous silicon refers to n type amorphous silicon having a high impurity doping concentration. Alternatively, the amorphous silicon layer 340' may include, for example, p type amorphous silicon. In this example, the amorphous silicon layer 340' may include p+ type amorphous silicon. The p+ type amorphous silicon may refer to p type amorphous silicon having a high impurity doping concentration.

Figure 10:
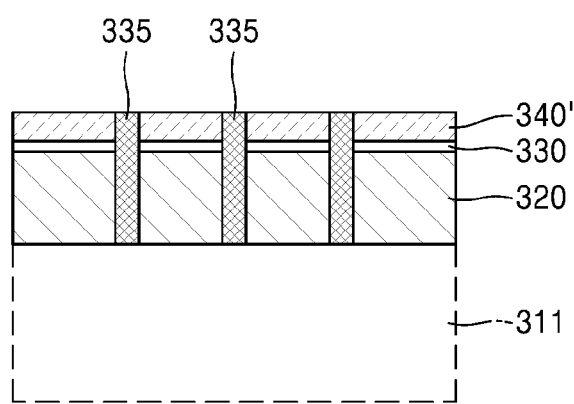

Referring to FIG. 10, at least one metal plug 335 is formed to penetrate through the amorphous silicon layer 340', the catalyst layer 330, and the first insulation layer 320. In detail, at least one via hole is formed to penetrate through the amorphous silicon layer 340', the catalyst layer 330, and the first insulation layer 320. An inside of the at least one via hole is filled with predetermined metal, and thus the at least one metal plug 335 is formed.

Figure 11:
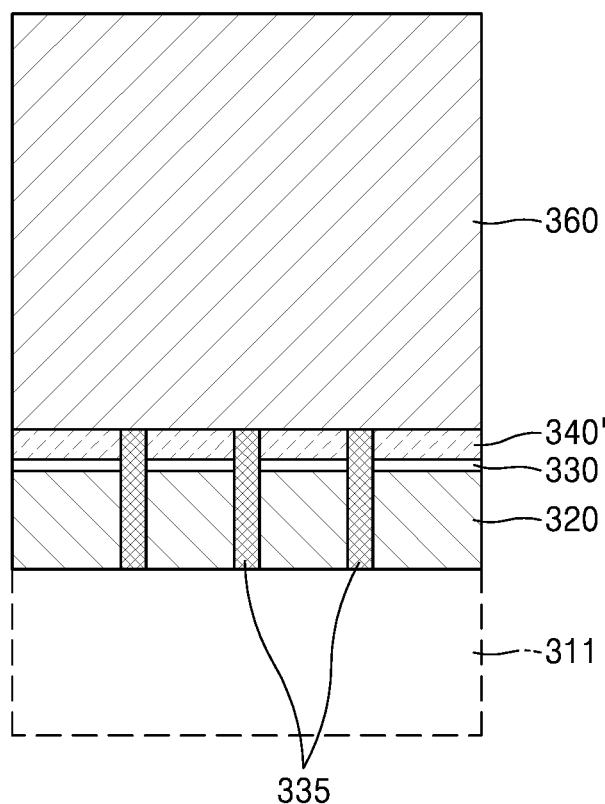

Referring to FIG. 11, a second insulation layer 360 is formed on the amorphous silicon layer 340'. The second insulation layer 360 may include, for example, silicon oxide, silicon nitride, or aluminum oxide. The second insulation layer 360 may be formed by, for example, PVD, CVD, or ALD. The second insulation layer 360 may have a thickness corresponding to a height of a Si nanowire 350 that is described below. For example, the second insulation layer 360 may be formed to have a thickness of about several micrometers to several tens of micrometers. However, exemplary embodiments are not limited thereto.

Figure 12:
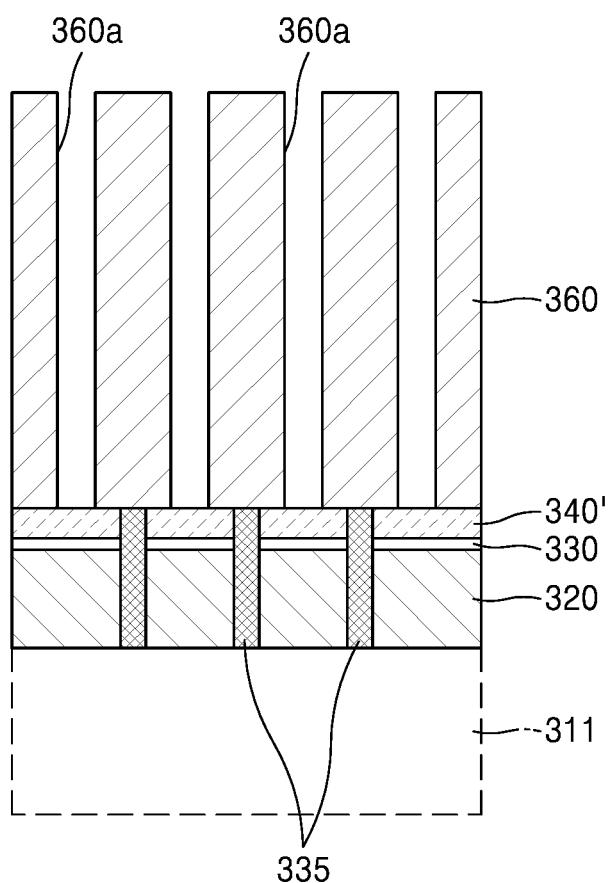

Referring to FIG. 12, at least one nano-hole 360a is formed in the second insulation layer 360. The at least one nano-hole 360a is formed to penetrate through the second insulation layer 360. Accordingly, an upper surface of the amorphous silicon layer 340' is exposed through the at least one nano-hole 360a. The at least one nano-hole 360a may be formed to have a diameter of, for example, about several nanometers to several hundreds of nanometers. However, exemplary embodiments are not limited thereto. The at least one nano-hole 360a may be formed by etching the second insulation layer 360, for example, by anisotropic dry etching.

Figure 13:
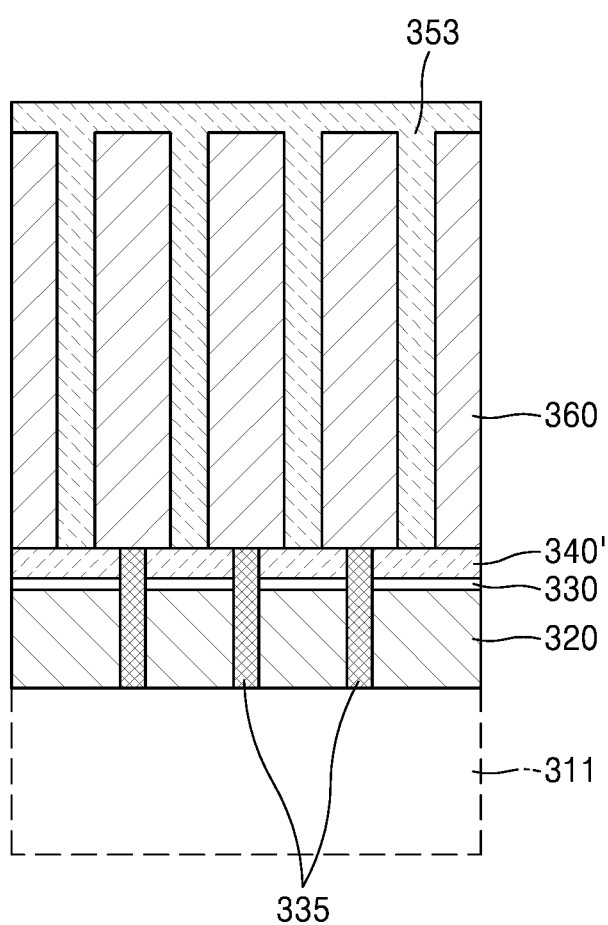

Referring to FIG. 13, an amorphous silicon material layer 353 is formed by depositing amorphous silicon on the second insulation layer 360 to fill the at least one nano-hole 360a. The deposition of the amorphous silicon may be performed by, for example, PVD, CVD, or ALD. The amorphous silicon material layer 353 may fill the at least one nano-hole 360a, and simultaneously form on an upper surface of the second insulation layer 360.

The amorphous silicon material layer 353 may include first conductive type amorphous silicon. For example, if the amorphous silicon layer 340' includes n type amorphous silicon, the amorphous silicon material layer 353 may include n type amorphous silicon. In a detailed example, if the amorphous silicon layer 340' includes n+ type amorphous silicon, the amorphous silicon material layer 353 may include n− type amorphous silicon. The n− type amorphous silicon refers to n type amorphous silicon having an impurity doping concentration that is lower than that of the n+ amorphous silicon. Alternatively, if the amorphous silicon layer 340' includes p type amorphous silicon, the amorphous silicon material layer 353 may include, for example, p type amorphous silicon. In a detailed example, if the amorphous silicon layer 340' includes p+ type amorphous silicon, the amorphous silicon material layer 353 may include p− type amorphous silicon. The p− type amorphous silicon refers to p type amorphous silicon having an impurity doping concentration that is lower than that of the p+ amorphous silicon. Alternatively, the amorphous silicon material layer 353 may include, for example, undoped amorphous silicon.

Figure 14:
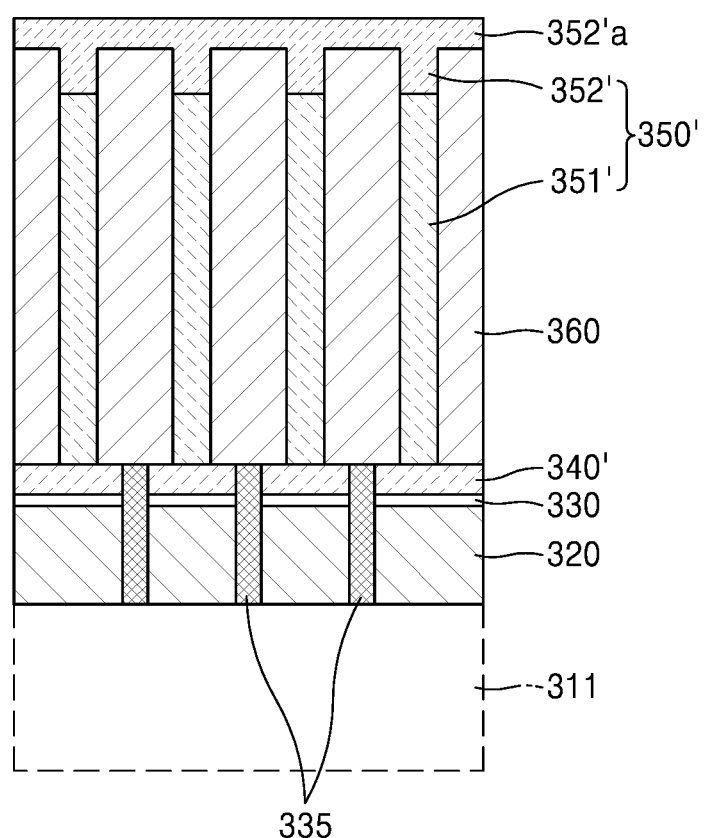

Referring to FIG. 14, an upper portion of the amorphous silicon material layer 353 is doped. Accordingly, an amorphous Si nanowire 350' including a first amorphous Si nanowire 351' and a second amorphous Si nanowire 352' extending from the first amorphous Si nanowire 351' is formed in the at least one nano-hole 360a. A doped upper amorphous silicon layer 352'a is formed on an upper portion of the second insulation layer 360. The first amorphous Si nanowire 351' may include, for example, first conductive type amorphous silicon or undoped amorphous silicon. The second amorphous Si nanowire 352' and the doped upper amorphous silicon layer 352'a may include, for example, second conductive type amorphous silicon.

In a detailed example, if the amorphous silicon layer 340' includes n type amorphous silicon, the second amorphous Si nanowire 352' and the doped upper amorphous silicon layer 352'a may include p type amorphous silicon. In this example, the first amorphous Si nanowire 351' may include n type amorphous silicon or undoped amorphous silicon. Also, in another detailed example, if the amorphous silicon layer 340' includes p type amorphous silicon, the second amorphous Si nanowire 352' and the doped upper amorphous silicon layer 352'a may include n type amorphous silicon. In this example, the first amorphous Si nanowire 351' may include p type amorphous silicon or undoped amorphous silicon.

Figure 15:
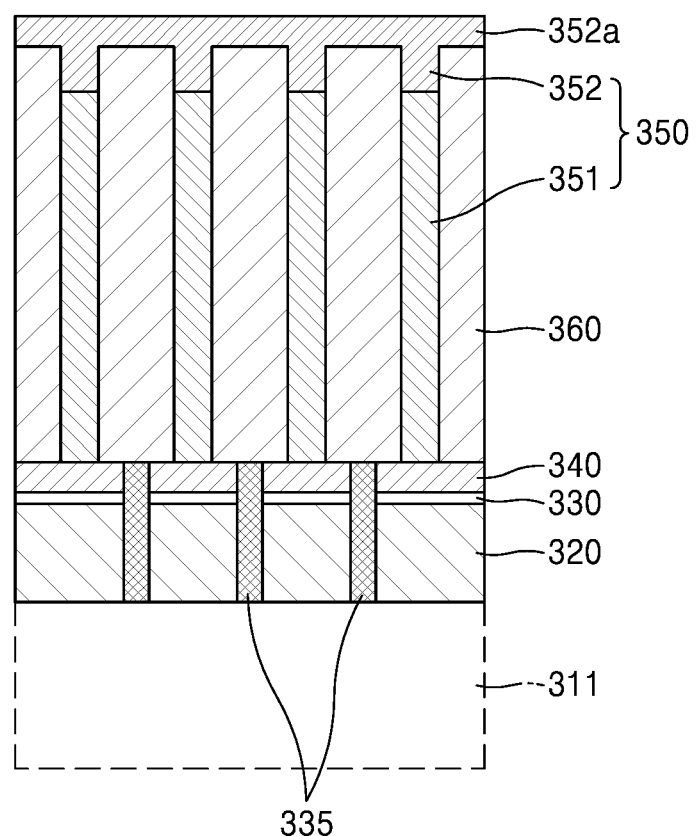

Referring to FIG. 15, a silicon layer 340, a Si nanowire 350, and a doped upper silicon layer 352a are formed by respectively crystallizing the amorphous silicon layer 340', the amorphous Si nanowire 350', and the doped upper amorphous silicon layer 352'a through an MIC process. When the MIC process is performed, metal (for example, nickel induced from metal oxide, such as nickel oxide) forming the catalyst layer 330 sequentially crystallizes the amorphous silicon layer 340', the amorphous Si nanowire 350', and the doped upper amorphous silicon layer 352'a. Although the MIC process may be performed at a temperature of, for example, about 450° C. to about 600° C., exemplary embodiments are not limited thereto. Also, the MIC process may be performed under an inert gas atmosphere such as, for example, argon atmosphere or a nitrogen atmosphere. After the MIC process, the catalyst layer 330 may be left between the first insulation layer 320 and the silicon layer 340, or may not be left therebetween.

According to the crystallization process, the silicon layer 340 may include, for example, first conductive type silicon. The Si nanowire 350 includes a first Si nanowire 351 disposed on the silicon layer 340 and a second Si nanowire 352 extending from the first Si nanowire 351. The Si nanowire 350 may have a diameter of about nanometers to several hundreds of nanometers, and a height of about several micrometers to several tens of micrometers. The first Si nanowire 351 may include, for example, first conductive type silicon or undoped silicon. The second Si nanowire 352 may include, for example, second conductive type silicon. The doped upper silicon layer 352a may include, for example, second conductive type silicon.

In a detailed example, if the silicon layer 340 includes n type silicon, the second Si nanowire 352 and the doped upper silicon layer 352a may include p type silicon. The first Si nanowire 351 may include, for example, n type silicon or undoped silicon. Also, in another detailed example, if the silicon layer 340 includes p type silicon, the second Si nanowire 352 and the doped upper silicon layer 352a may include n type silicon. The first Si nanowire 351 may include, for example, p type silicon or undoped silicon.

Figure 16:
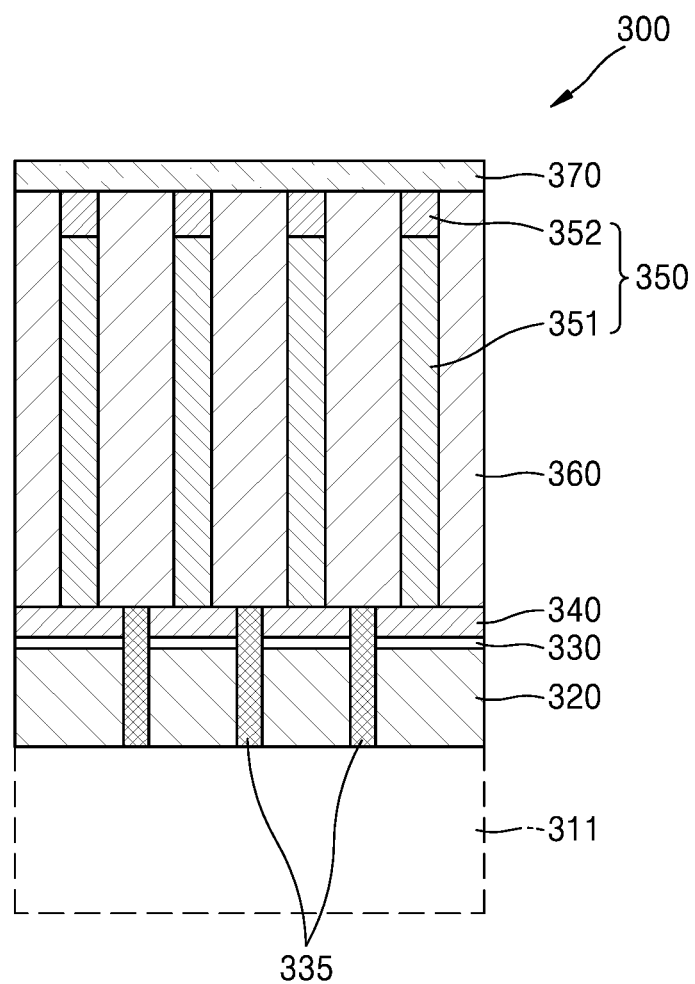

Referring to FIG. 16, after removing the doped upper silicon layer 352a by etching, an electrode 370 is formed on an upper surface of the second insulation layer 360, thereby completing the manufacture of the photodetecting device 300. The electrode 370 electrically contacts an upper end of the Si nanowire 350, that is, an upper end of the second Si nanowire 352. The electrode 370 may include, for example, TCO such as ITO. The electrode 370 may be formed by depositing TCO on the upper surface of the second insulation layer 360 by, for example, PVD, CVD, or ALD. Alternatively, if the photodetecting device 300 is formed on the substrate 311, the photodetecting device 300 may be separated from the substrate 311. However, the photodetecting device 300 may not be separated from the substrate 311.

Alternatively, although not illustrated, after forming the electrode 270, a planarization layer and a microlens layer may be further formed on the electrode 270.

Figure 17:
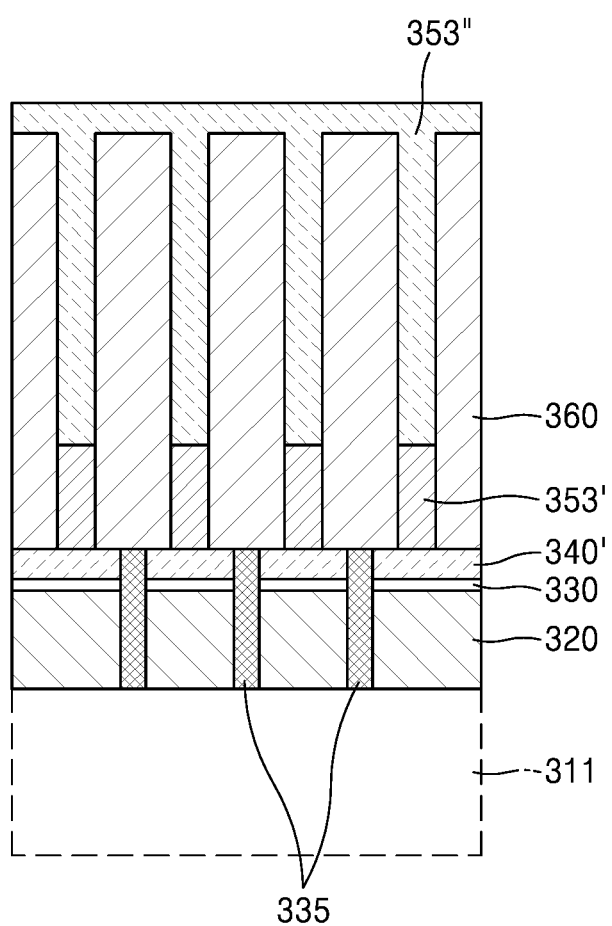
Figure 18:
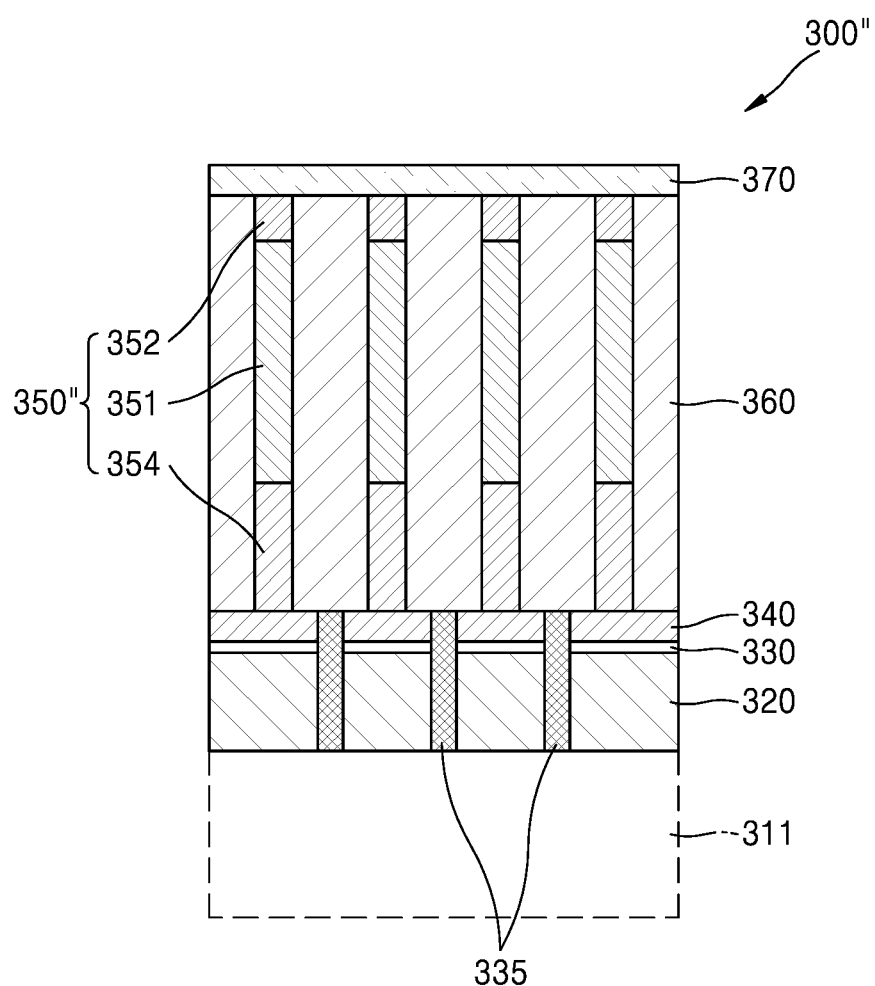

FIGS. 17 and 18 illustrate a method of manufacturing a photodetecting device 300", according to another exemplary embodiment.

Referring to FIG. 17, in the stage illustrated in FIG. 12, the nano-holes 360a formed in the second insulation layer 360 are sequentially filled with a doped amorphous silicon layer 353' and an undoped amorphous silicon layer 353". The doped amorphous silicon layer 353' may include, for example, first conductive amorphous silicon. Then, after the above-described doping process and crystallization process are performed, the photodetecting device 300" illustrated in FIG. 18 is completely manufactured. In the photodetecting device 300" of FIG. 18, a Si nanowire 350" includes the first Si nanowire 351, the second Si nanowire 352 extending from the upper end of the first Si nanowire 351, and a third Si nanowire 354 extending from a lower end of the first Si nanowire 351. For example, the third Si nanowire 354 may include first conductive type silicon, and the second Si nanowire 352 may include second conductive type silicon. The first Si nanowire 351 may include, for example, undoped silicon.

FIGS. 19 to 22 are diagrams illustrating a method of manufacturing an image sensor, according to an exemplary embodiment. In FIGS. 19 to 22, a method of manufacturing a pixel of the image sensor is illustrated. In the description below, an example in which the pixel includes a red photodetecting device 400R, a green photodetecting device 400G, and a blue photodetecting device 400B is described.

Figure 19:
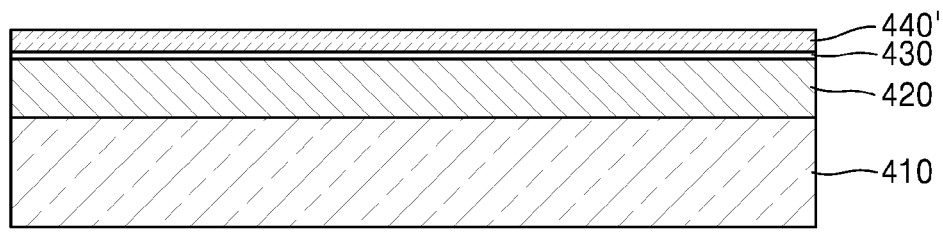
FIGS. 19, 20, 21, and 22 are diagrams illustrating a method of manufacturing an image sensor, according to an exemplary embodiment.

Referring to FIG. 19, a circuit substrate 410 is prepared. The circuit substrate 410 refers to a substrate including an electrode pattern having a predetermined shape. The circuit substrate 410 may include, for example, a CMOS substrate, a PCB, or a display panel. However, exemplary embodiments are not limited thereto. Next, a first insulation layer 420, a catalyst layer 430, and an amorphous silicon layer 440' are sequentially formed on the circuit substrate 410. Because the forming of the first insulation layer 420, the catalyst layer 430, and the amorphous silicon layer 440' is described above, detailed descriptions thereof are omitted.

Figure 20:
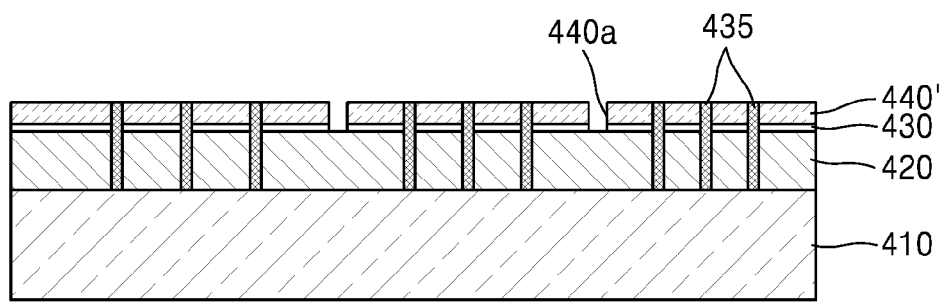

Referring to FIG. 20, a plurality of metal plugs 435 are formed to penetrate through the amorphous silicon layer 440', the catalyst layer 430, and the first insulation layer 420. The metal plugs 435 are formed to electrically contact the electrode pattern of the circuit substrate 410. Because the forming of the metal plugs 435 is described above, a detailed description thereof is omitted. A plurality of line patterns 440a are formed to penetrate through the amorphous silicon layer 440' and the catalyst layer 430. The line patterns 440a insulate between red, green, and blue photodetecting devices 400R, 400G, and 400B, which are described below.

Figure 21:
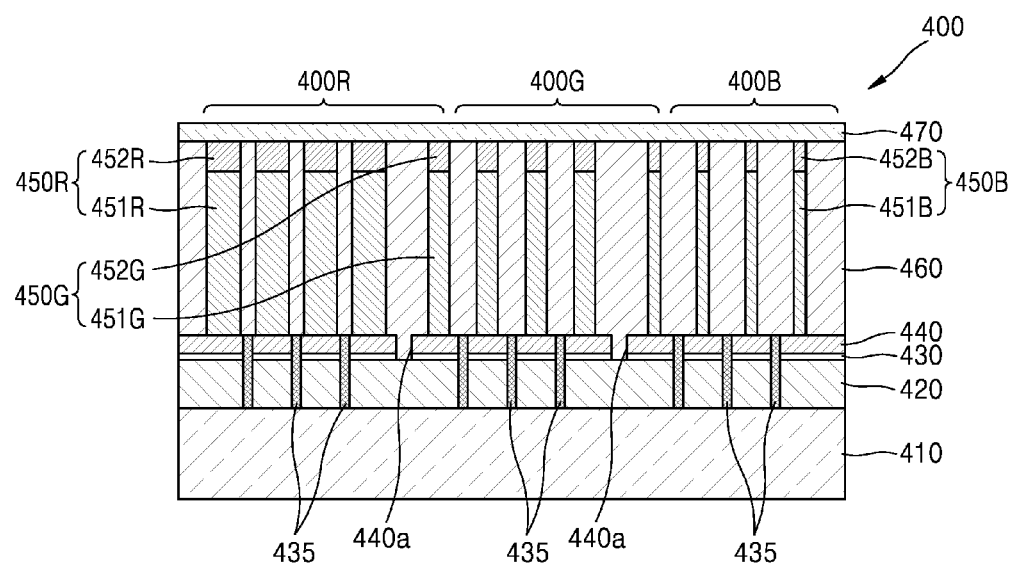
Figure 22:
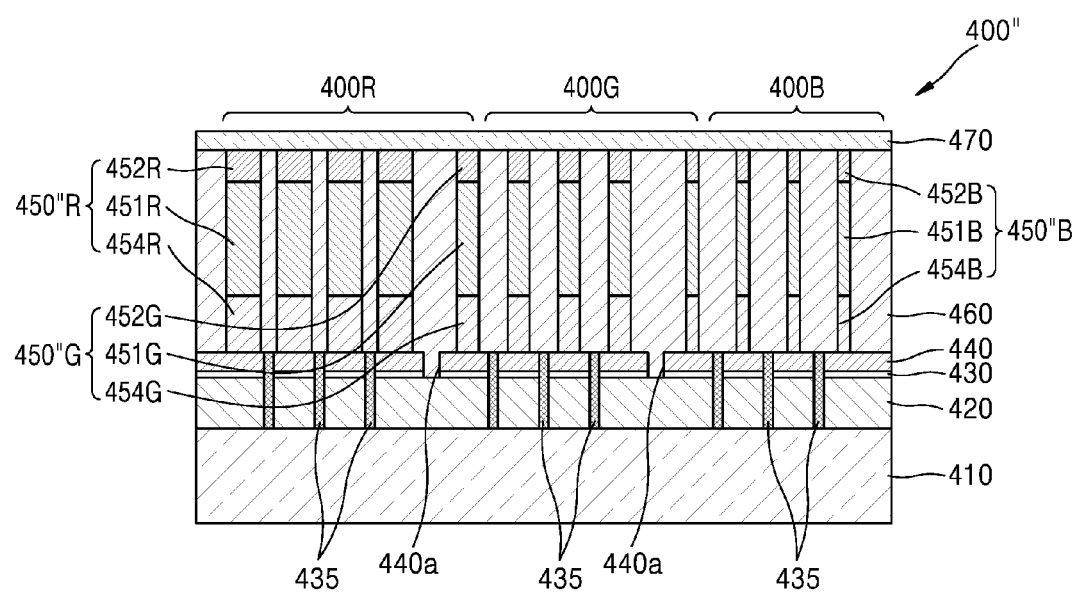

Referring to FIG. 21, when the red, green, and blue photodetecting devices 400R, 400G, and 400B are formed on the circuit substrate 410, a pixel 400 of the image sensor is completely formed. Because the forming of the red, green, and blue photodetecting devices 400R, 400G, and 400B is described in detail in the above-described exemplary embodiments, descriptions thereof are omitted. As illustrated in FIG. 15, the red photodetecting device 400R includes at least one red Si nanowire 450R disposed on a silicon layer 440 crystallized from the amorphous silicon layer 440'. The at least one red Si nanowire 450R has a diameter that detects a red light beam. The at least one red Si nanowire 450R may have a diameter that is greater than those of the green and blue Si nanowires 450G and 450B.

The red Si nanowires 450R may be disposed to be perpendicular to or inclined at an angle with respect to the silicon layer 440. Each of the red Si nanowires 450R includes a first red Si nanowire 451R disposed on the silicon layer 440 and a second red Si nanowire 452R extending from the first red Si nanowire 451R.

The green photodetecting device 400G includes the at least one green Si nanowire 450G disposed on the silicon layer 440. The at least one green Si nanowire 450G has a diameter that detects a green light beam. The at least one green Si nanowire 450G may have a diameter that is less than that of the least one of red Si nanowires 450R and greater than that of the at least one blue Si nanowire 450B. The green Si nanowires 450G may be disposed to be perpendicular to or inclined at an angle with respect to the silicon layer 440. Each of the green Si nanowires 450G includes a first green Si nanowire 451G disposed on the silicon layer 440 and a second green Si nanowire 452G extending from the first green Si nanowire 451G.

The blue photodetecting device 400B includes the at least one blue Si nanowire 450B disposed on the silicon layer 440. The at least one blue Si nanowire 450B has a diameter that detects a blue light beam. The at least one blue Si nanowire 450B may have a diameter that is less than those of the red and green Si nanowires 450R and 450G. The blue Si nanowires 450B may be disposed to be perpendicular to or inclined at an angle with respect to the silicon layer 440. Each of the blue Si nanowires 450B includes a first blue Si nanowire 451B disposed on the silicon layer 440 and a second blue Si nanowire 452B extending from the first blue Si nanowire 451B.

An electrode 470 is formed of a transparent material on an upper surface of a second insulation layer 460 formed on the silicon layer 440. The electrode 470 is electrically connected to upper ends of the red, green, and blue Si nanowires 450R, 450G, and 450B. Although not illustrated, after forming the electrode 470, a planarization layer and a microlens layer may be further formed on the electrode 470.

Referring to FIG. 21, alternatively, when the above-described doping process and crystallization process are performed after sequentially filling nano-holes formed in the second insulation layer 460 with a doped amorphous silicon layer and an undoped amorphous silicon layer, a pixel 400" of the image sensor is completely manufactured. The doped amorphous silicon layer may include first conductive amorphous silicon. In the pixel 400" of the image sensor of FIG. 22, a red Si nanowire 450"R includes the first red Si nanowire 451R, the second red Si nanowire 452R extending from an upper end of the first red Si nanowire 451R, and a third red Si nanowire 454R extending from a lower end of the first red Si nanowire 451R. A green Si nanowire 450"G includes the first green Si nanowire 451G, the second green Si nanowire 452G extending from an upper end of the first green Si nanowire 451G, and a third green Si nanowire 454G extending from a lower end of the first green Si nanowire 451G. Also, a blue Si nanowire 450"B includes the first blue Si nanowire 451B, the second blue Si nanowire 452B extending from an upper end of the first blue Si nanowire 451B, and a third blue Si nanowire 454B extending from a lower end of the first blue Si nanowire 451B. For example, the third red, green, and blue Si nanowires 454R, 454G, and 454B may include first conductive type silicon, and the second red, green, and blue Si nanowires 452R, 452G, and 452B may include second conductive type silicon. The first Si nanowires 451R, 451G, and 451B may include, for example, undoped silicon.

FIGS. 23 to 28 are diagrams illustrating a method of manufacturing an image sensor, according to another exemplary embodiment.

Figure 23:
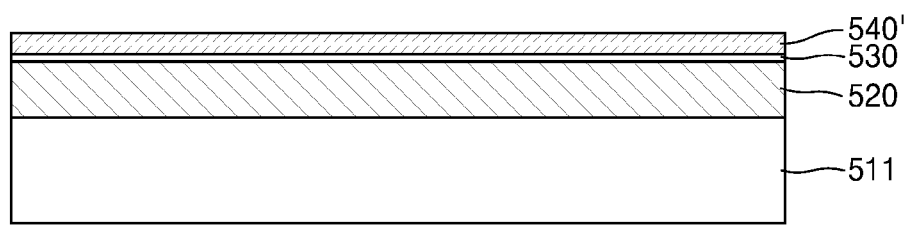
FIGS. 23, 24, 25, 26, 27, and 28 are diagrams illustrating a method of manufacturing an image sensor, according to another exemplary embodiment.

Referring to FIG. 23, a first insulation layer 520, a catalyst layer 530, and an amorphous silicon layer 540' are sequentially formed on a substrate 511. Because the forming of the first insulation layer 520, the catalyst layer 530, and the amorphous silicon layer 540' are described above, detailed descriptions thereof are omitted.

Figure 24:
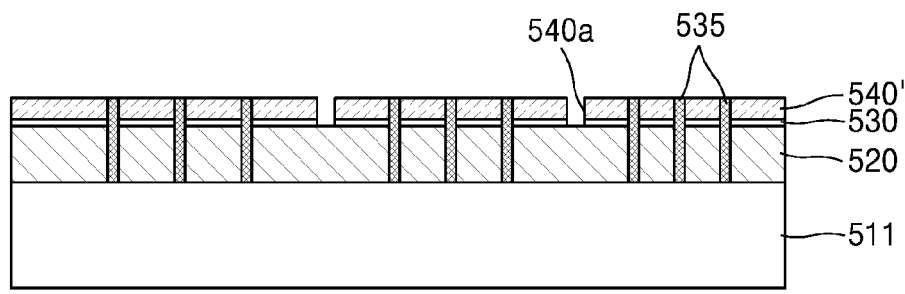

Referring to FIG. 24, a plurality of metal plugs 535 are formed to penetrate through the amorphous silicon layer 540', the catalyst layer 530, and the first insulation layer 520. Because the forming of the metal plugs 535 is described above, a detailed description thereof is omitted. A plurality of line patterns 540a are formed to penetrate through the amorphous silicon layer 540' and the catalyst layer 530. The line patterns 540a insulate between red, green, and blue photodetecting devices 500R, 500G, and 500B, which are described below.

Figure 25:
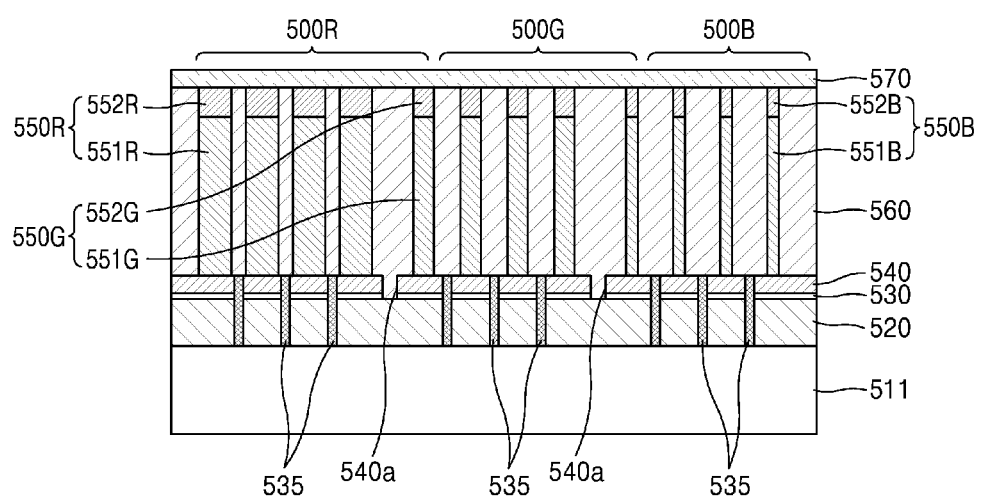

Referring to FIG. 25, the red, green, and blue photodetecting devices 500R, 500G, and 500B are formed on the substrate 511. Because the forming of the red, green, and blue photodetecting devices 500R, 500G, and 500B is described in detail in the above-described exemplary embodiments, descriptions thereof are omitted. As illustrated in FIG. 25, the red photodetecting device 500R includes at least one red Si nanowire 550R disposed on a silicon layer 540 crystallized from the amorphous silicon layer 540'. The at least one red Si nanowire 550R has a diameter that detects a red light beam. The at least one red Si nanowire 550R may have a diameter that is greater than those of green and blue Si nanowires 550G and 550B. The red Si nanowires 550R may be disposed to be perpendicular to or inclined at an angle with respect to the silicon layer 540. Each of the red Si nanowires 550R includes a first red Si nanowire 551R disposed on the silicon layer 540 and a second red Si nanowire 552R extending from the first red Si nanowire 551R.

The green photodetecting device 500G includes at least one green Si nanowire 550G disposed on the silicon layer 540. The at least one green Si nanowire 550G has a diameter that detects a green light beam. The at least one green Si nanowire 550G may have a diameter that is less than that of the at least one red Si nanowire 550R and greater than that of the at least one blue Si nanowire 550B. The green Si nanowires 550G may be disposed to be perpendicular to or inclined at an angle with respect to the silicon layer 540. Each of the green Si nanowires 550G includes a first green Si nanowire 551G disposed on the silicon layer 540 and a second green Si nanowire 552G extending from the first green Si nanowire 551G.

The blue photodetecting device 500B includes at least one blue Si nanowire 550B disposed on the silicon layer 540. The at least one blue Si nanowire 550B has a diameter that detects a blue light beam. The at least one blue Si nanowire 550B may have a diameter that is less than those of red and green Si nanowires 550R and 550G. The blue Si nanowires 550B may be disposed to be perpendicular to or inclined at an angle with respect to the silicon layer 540. Each of the blue Si nanowires 550B includes a first blue Si nanowire 551B disposed on the silicon layer 540 and a second blue Si nanowire 552B extending from the first blue Si nanowire 551B.

An electrode 570 is formed of a transparent material on an upper surface of a second insulation layer 560 formed on the silicon layer 540. The electrode 570 is electrically connected to upper ends of the red, green, and blue Si nanowires 550R, 550G, and 550B. Although not illustrated, after forming the electrode 570, a planarization layer and a microlens layer may be further formed on the electrode 570.

Figure 26:
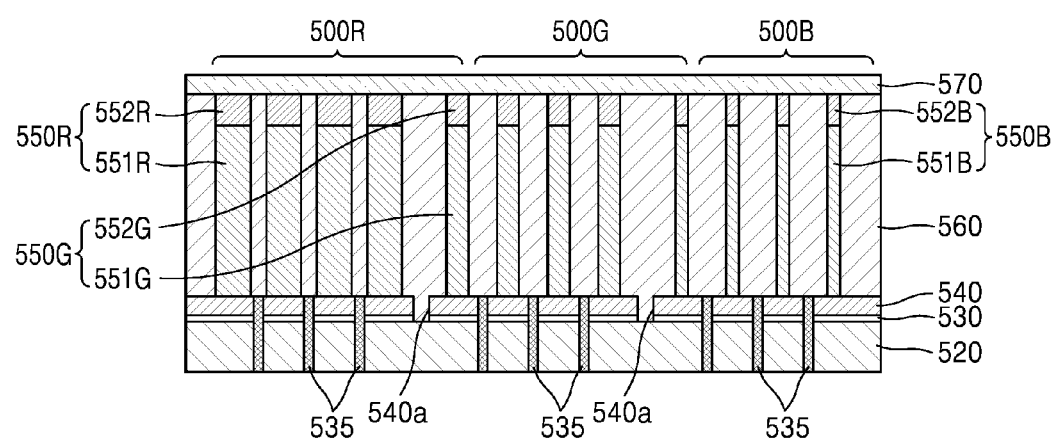
Figure 27:
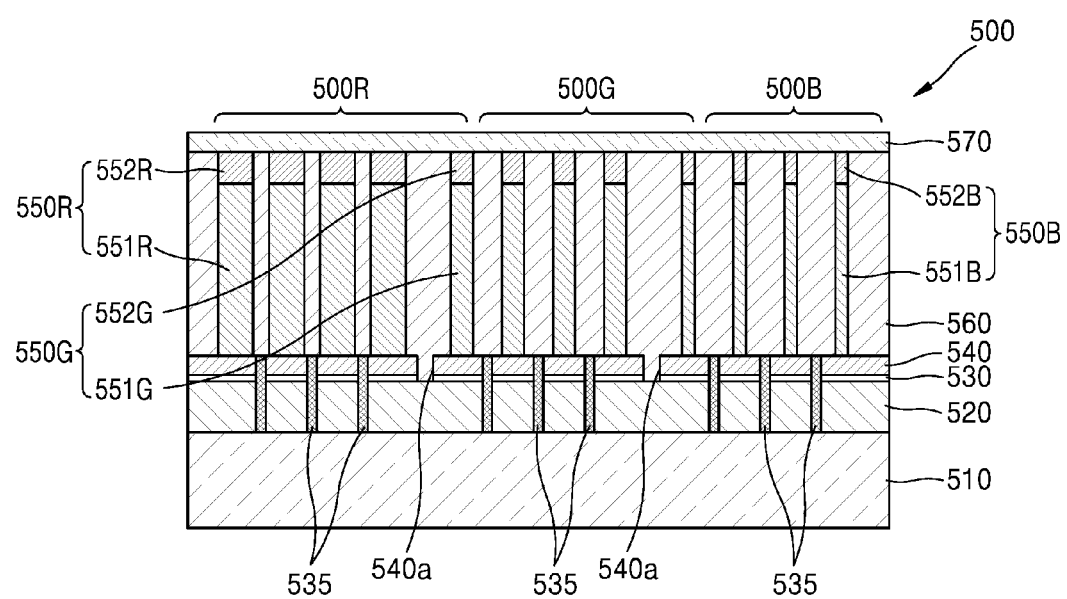

Referring to FIG. 26, the red, green, and blue photodetecting devices 500R, 500G, and 500B are separated from the substrate 511. Referring to FIG. 27, the red, green, and blue photodetecting devices 500R, 500G, and 500B that are separated from the substrate 511 are transferred to be formed on a circuit substrate 510, thereby completing the manufacture of a pixel 500 of the image sensor. The circuit substrate 510 refers to a substrate having an electrode pattern having a predetermined shape. The circuit substrate 510 may include, for example, a CMOS substrate, a PCB, or a display panel. However, exemplary embodiments are not limited thereto. The metal plugs 535 disposed in the red, green, and blue photodetecting devices 500R, 500G, and 500B are electrically connected to the electrode pattern of the circuit substrate 510 through the above transfer process.

Figure 28:
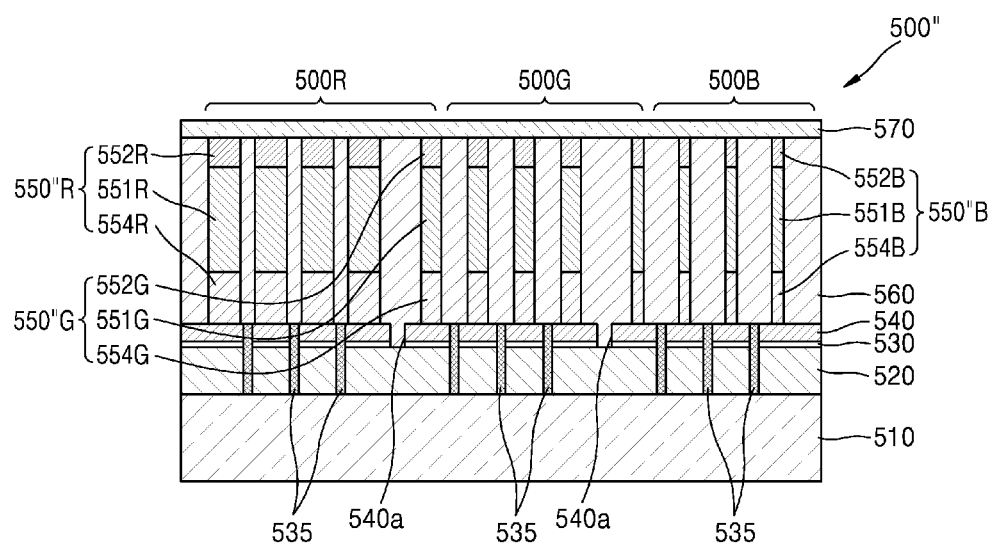

Referring to FIG. 28, alternatively, when the above-described doping process and the crystallization process are performed after nano-holes formed in the second insulation layer 560 are sequentially filled with a doped amorphous silicon layer and an undoped amorphous silicon layer, a pixel 500" of the image sensor is completely manufactured. The doped amorphous silicon layer may include first conductive amorphous silicon. In the pixel 500" of the image sensor of FIG. 28, a red Si nanowire 550"R includes the first red Si nanowire 551R, the second red Si nanowires 552R extending from an upper end of the first red Si nanowire 551R, and a third red Si nanowire 554R extending from a lower end of the first red Si nanowire 551R. A green Si nanowire 550"G includes the first green Si nanowire 551G, the second green Si nanowire 552G extending from an upper end of the first green Si nanowire 551G, and the third green Si nanowire 554G extending from a lower end of the first green Si nanowire 551G. Also, a blue Si nanowire 550"B includes the first blue Si nanowire 551B, the second blue Si nanowire 552B extending from an upper end of the first blue Si nanowire 551B, and a third blue Si nanowire 554B extending from a lower end of the first blue Si nanowire 551B. For example, the third red, green, and blue Si nanowires 554R, 554G, and 554B may include first conductive type silicon, and the second red, green, and blue Si nanowires 552R, 552G, and 552B may include second conductive type silicon. The first Si nanowires 551R, 551G, and 551B may include, for example, undoped silicon.

As described above, according to the above exemplary embodiments, a photodetecting device includes at least one Si nanowire, and the photodetecting device may detect a light beam of a desired wavelength by adjusting a diameter of each of the at least one Si nanowire. Also, an image sensor capable of forming a color image includes a plurality of photodetecting devices including Si nanowires having different diameters that are disposed on a circuit substrate. The photodetecting device and the image sensor configured as above may be manufactured by an MIC process using metal oxide having insulation properties as a catalyst layer.

The foregoing exemplary embodiments and advantages are merely exemplary embodiments and are not to be construed as limiting the exemplary embodiments. The exemplary embodiments can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A photodetecting device comprising:
   a first insulation layer;
   a silicon layer disposed on the first insulation layer;
   a metal plug disposed through the first insulation layer and the silicon layer;
   a silicon wire disposed on the silicon layer;
   an electrode connected to the silicon wire; and
   a second insulation layer disposed between the silicon layer and the electrode, the second insulation layer being disposed on the metal plug and contacting the metal plug, and the second insulation layer encompassing the silicon wire.

2. The photodetecting device of claim 1, further comprising a catalyst layer disposed between the first insulation layer and the silicon layer.

3. The photodetecting device of claim 2, wherein the catalyst layer comprises metal oxide having insulation properties.

4. The photodetecting device of claim 1, wherein the silicon wire comprises:
   a first silicon wire disposed on the silicon layer; and
   a second silicon wire extending from the first silicon wire, the second silicon wire being connected to the electrode.

5. The photodetecting device of claim 4, wherein the silicon layer comprises first conductive type silicon.

6. The photodetecting device of claim 5, wherein the first silicon wire comprises the first conductive type silicon or undoped silicon, and
   the second silicon wire comprises second conductive type silicon.

7. The photodetecting device of claim 1, wherein the silicon wire comprises:
   a first silicon wire;
   a second silicon wire extending from a first end of the first silicon wire, the second silicon wire being connected to the electrode; and
   a third silicon wire extending from a second end of the first silicon wire, the third silicon wire being connected to the silicon layer.

8. The photodetecting device of claim 7, wherein the first silicon wire comprises undoped silicon,
   the silicon layer and the third silicon wire comprise first conductive type silicon, and
   the second silicon wire comprises second conductive type silicon.

9. The photodetecting device of claim 1, further comprising a lens layer disposed on the electrode.

10. The photodetecting device of claim 9, further comprising a planarization layer disposed between the electrode and the lens layer.

11. The photodetecting device of claim 1, wherein the metal plug is disposed completely through the first insulation layer and the silicon layer.

12. An image sensor having pixels, each of the pixels comprising:
    a circuit substrate; and
    photodetecting devices disposed on the circuit substrate, each of the photodetecting devices comprising:
       a first insulation layer;
       a silicon layer disposed on the first insulation layer;
       a metal plug disposed through the first insulation layer and the silicon layer, the metal plug being connected to the circuit substrate;
       a silicon wire disposed on the silicon layer;
       an electrode connected to the silicon wire; and a second insulation layer disposed between the silicon layer and the electrode, the second insulation layer being disposed on the metal plug and contacting the metal plug, and the second insulation layer encompassing the silicon wire.

13. The image sensor of claim 12, wherein the photodetecting devices further comprise silicon wires having different diameters, and the silicon wires are configured to detect light beams of different colors.

14. The image sensor of claim 12, wherein the circuit substrate comprises one among a complementary metal-oxide-semiconductor substrate, a printed circuit board, and a display panel.

15. The image sensor of claim 12, each of the photodetecting devices further comprises a catalyst layer disposed between the first insulation layer and the silicon layer.

16. The image sensor of claim 15, wherein each of the photodetecting devices further comprises a line pattern through the silicon layer and the catalyst layer, the line pattern being disposed between two of the photodetecting devices.

* * * * *